United States Patent
Murase et al.

(10) Patent No.: US 6,210,597 B1
(45) Date of Patent: *Apr. 3, 2001

(54) RADIO WAVE ABSORBENT

(75) Inventors: Taku Murase; Masatsugu Morita; Naoyoshi Sato, all of Chiba-ken (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/308,239

(22) PCT Filed: Sep. 18, 1998

(86) PCT No.: PCT/JP98/04209

§ 371 Date: May 21, 1999

§ 102(e) Date: May 21, 1999

(87) PCT Pub. No.: WO99/16090

PCT Pub. Date: Apr. 1, 1999

(30) Foreign Application Priority Data

Sep. 25, 1997 (JP) .................................................. 9-278248

(51) Int. Cl.$^7$ ................................ H01R 1/00; H01R 1/34
(52) U.S. Cl. .................. 252/62.6; 252/62.64; 252/62.62; 341/1; 307/91; 361/818; 455/300
(58) Field of Search ................................ 252/62.6, 62.62, 252/62.64; 342/1; 307/91; 361/818; 523/139; 455/300

(56) References Cited

FOREIGN PATENT DOCUMENTS

| 49-27225 B4 | 7/1974 | (JP) . |
|---|---|---|
| 63-69753 | 3/1988 | (JP) . |
| 01072925 | 3/1989 | (JP) . |
| 01301524 | 12/1989 | (JP) . |
| 03200303 | 9/1991 | (JP) . |
| 5-51249 | 3/1993 | (JP) . |
| 05129123 | 5/1993 | (JP) . |
| 05243023 | 9/1993 | (JP) . |
| 06084622 | 3/1994 | (JP) . |
| 6-151150 | 5/1994 | (JP) . |
| 8-12335 | 1/1996 | (JP) . |

OTHER PUBLICATIONS

Derwent Abstract for JP 61–48430, Mar. 10, 1986.*

* cited by examiner

*Primary Examiner*—C. Melissa Koslow
(74) *Attorney, Agent, or Firm*—Oblon, Spivak, McClelland, Maier & Neustadt, P.C.

(57) ABSTRACT

Since the radio wave absorbent of the present invention has the main component of a magnesium-zinc system ferrite material containing 45 to 50 mol % of iron oxide, 7 to 19.7 mol % of magnesium oxide, 24 to 28.5 mol % of zinc oxide, 4 to 16 mol % of copper oxide, and 0.1 to 6 mol % of manganese oxide, a matching thickness is less than 8 mm, and the total weight of the radio wave absorbent for use in the inner wall of a radio wave dark room or the outer wall of a building or the like is remarkably reduced as compared with the radio wave absorbent obtained by sintering the conventional magnesium-zinc system ferrite material. Moreover, since the radio wave absorbent can be obtained by sintering the material at a relatively low sintering temperature of about 950 to 1150° C., the manufacture cost can be reduced relative to the radio wave absorbent obtained by sintering the conventional nickel-zinc system ferrite material.

4 Claims, No Drawings

RADIO WAVE ABSORBENT

TECHNICAL FIELD

The present invention relates to a radio wave absorbent for use in a radio wave dark room, a radio wave absorptive wall, which is composed of a magnesium-zinc system ferrite.

BACKGROUND ART

Recently, with the progress of information communication technique or the prevalence of various electric apparatus, the influence of unnecessary electromagnetic noises exerted onto precision apparatus associated devices has raised problems. For the measurement of electromagnetic noises, a radio wave dark room (anechoic room) where there is no reflection of electromagnetic waves is used, and a radio wave absorbent is used in the inner wall of the radio wave dark room. Moreover, in order to prevent reception trouble from being caused by reflection of television waves by high-rise buildings or the like, the radio wave absorbent is used in the outer wall of the building or the like.

As a conventional radio wave absorbent, for example, used is a radio wave absorbent having a characteristic that a reflection attenuation in a frequency band of 90 MHz to 350 MHz is 20 dB or more. As the radio wave absorbent, for example, a radio wave absorbent obtained by sintering a nickel-zinc system ferrite material (Japanese Patent Application Laid-open Nos. 200303/1991, 129123/1993, 243023/1993, 84622/1994, and the like) and a radio wave absorbent obtained by sintering a magnesium-zinc system ferrite material (Japanese Patent Application Laid-open Nos. 72925/1989, 301524/1989, and the like) are exemplified.

However, the conventional radio wave absorbent which is obtained by sintering the nickel-zinc system ferrite material has a problem that a raw-material nickel is expensive.

On the other hand, the magnesium-zinc system ferrite material has a sintering temperature of around 1250 to 1300° C., which is higher than the sintering temperature of about 1100° C. of the nickel-zinc system ferrite material. Therefore, when the radio wave absorbent is industrially manufactured by sintering the magnesium-zinc system ferrite material, there is a problem that a high-temperature sintering furnace is necessary separately from a sintering furnace for the nickel-zinc system ferrite material.

Furthermore, the matching thickness in which all incoming radio waves are absorbed without causing reflection is important in the radio wave absorbent, but the radio wave absorbent obtained by sintering the conventional magnesium-zinc system ferrite material has a matching thickness of 8 mm or more, and is thicker than the radio wave absorbent obtained by sintering the nickel-zinc system ferrite material (matching thickness of 7 mm or less). The difference of about 1 mm in matching thickness exerts a remarkable influence on the total weight of the radio wave absorbent for use in the inner wall of the radio wave dark room or the outer wall of the building or the like, and the reduction of the matching thickness is constantly requested for in the radio wave absorbent.

The present invention has been developed in consideration of the circumstances described above, and an object thereof is to provide a radio wave absorbent which has a matching thickness of less than 8 mm and which can be obtained by sintering the material at a relatively low sintering temperature.

DISCLOSURE OF THE INVENTION

To attain this and other objects, the present invention provides a radio wave absorbent which is obtained by sintering a magnesium-zinc system ferrite material and which has the main component of a magnesium-zinc system ferrite containing 45 to 50 mol % of iron oxide, 7 to 19.7 mol % of magnesium oxide, 24 to 28.5 mol % of zinc oxide, 4 to 16 mol % of copper oxide, and 0.1 to 6 mol % of manganese oxide.

Moreover, in a preferable aspect, a reflection attenuation in a frequency band of 90 MHz to 350 MHz is 20 dB or more.

In another preferable aspect, a matching thickness is less than 8 mm.

In further preferable aspect, a sintering temperature is in the range of 950 to 1150° C.

According to the present invention, the radio wave absorbent contains main components of 45 to 50 mol % of iron oxide, 7 to 19.7 mol % of magnesium oxide, 24 to 28.5 mol % of zinc oxide, 4 to 16 mol % of copper oxide, and 0.1 to 6 mol % of manganese oxide, and sintering can be performed at a relatively low temperature of about 950 to 1150° C. The sintering temperature is remarkably lower than the sintering temperature of the conventional magnesium-zinc system ferrite material, and the sintering furnace for sintering the nickel-zinc system ferrite material can be used. Moreover, since the matching thickness is less than 8 mm, the total weight of the radio wave absorbent for use in the inner wall of the radio wave dark room or the outer wall of the building or the like is remarkably reduced as compared with that of the radio wave absorbent obtained by sintering the conventional magnesium-zinc system ferrite material. Furthermore, the radio wave absorbent of the present invention can reduce manufacture cost as compared with the radio wave absorbent obtained by sintering the conventional nickel-zinc system ferrite material.

BEST MODE FOR CARRYING OUT THE INVENTION

The embodiment of the present invention will be described below in detail.

The radio wave absorbent of the present invention is prepared by sintering a magnesium-zinc system ferrite material, and contains main components in the range of 45 to 50 mol % of iron oxide, 7 to 19.7 mol % of magnesium oxide, 24 to 28.5 mol % of zinc oxide, 4 to 16 mol % of copper oxide, and 0.1 to 6 mol % of manganese oxide.

In the composition region departing from the above-mentioned range, the matching thickness of the radio wave absorbent becomes 8 mm or more, $\mu'$ (the real number part of complex specific permeability) required for the radio wave absorbing characteristic in a low-frequency band is lowered, and further the peak width for the frequency of $\mu''$ (the imaginary number part of complex specific permeability) required for the radio wave absorbing characteristic becomes narrow. It is therefore difficult to set the reflection attenuation in the frequency band of 90 MHz to 350 MHz to at least 20 dB or more. Moreover, the matching thickness is enlarged.

Specifically, for example, when the content of iron oxide departs from the above-mentioned range, $\mu'$ is lowered. When the content of zinc oxide is less than the above-mentioned range, $\mu'$ is lowered. When the content of zinc oxide exceeds the above-mentioned range, Curie temperature is lowered, $\mu''$ is also lowered, and the matching thickness is enlarged. When the content of copper oxide is less than the above-mentioned range, it becomes difficult to sinter the material at a relatively low temperature of about 950 to 1150° C., in order to obtain the radio wave absorbent, and the matching thickness is further enlarged. On the other hand, when the content of copper oxide exceeds the above-mentioned range, $\mu'$ is lowered and the radio wave absorbing band is narrowed. Moreover, manganese oxide effectively promotes particle growth, enhances the initial permeability, lowers the resonance frequency of a magnetic wall, and expands the radio wave absorbing band toward the low-frequency side. When the content of manganese oxide exceeds the above-mentioned range, however, $\mu'$ is lowered, the specific permittivity is increased, and the radio wave absorbing characteristic is deteriorated.

In addition to the aforementioned components, the radio wave absorbent of the present invention may contain one or two or more of CaO, CoO, NiO, $SiO_2$, $TiO_2$, $SnO_2$, $MoO_3$, $WO_3$, $Bi_2O_3$, $In_2O_3$, $Cr_2O_3$, $Al_2O_3$, $Ta_2O_5$, $Nb_2O_5$, $V_2O_5$, and the like in a ratio of 1% by weight or less.

As aforementioned, the radio wave absorbent of the present invention can be obtained by sintering in the atmospheric air at a relatively low temperature of about 950 to 1150° C. the magnesium-zinc system ferrite material whose composition after sintering is in the range described above, and its matching thickness becomes less than 8 mm.

Specific examples relating to the present invention will hereinafter be illustrated to describe the present invention in further detail.

Preparation of Radio Wave Absorbents (Examples 1 to 26)

First, each component was weighed to obtain the composition after sintering in the following range, and wet-blended with a steel ball mill for 15 hours.

iron oxide ($Fe_2O_3$): 45 to 50 mol % magnesium oxide (MgO): 7 to 19.7 mol % zinc oxide (ZnO): 24 to 28.5 mol % copper oxide (CuO): 4 to 16 mol % manganese oxide (MnO): 0.1 to 6 mol %

Subsequently, the blended powder was tentatively calcined in the atmospheric air at 900° C. for two hours, and then wet-ground with the steel ball mill for 15 hours. The resultant magnesium-zinc system ferrite powder was loaded with 10% by weight of aqueous polyvinyl alcohol to perform granulation, and molded into a desired shape under a pressure of 1 ton/cm². The molded material was sintered in the atmospheric air at a predetermined temperature in the range of 950 to 1150° C. for three hours to obtain the radio wave absorbent (Examples 1 to 26). The composition, and sintering temperature/retention time of the radio wave absorbents (Examples 1 to 26) are shown in Table 1. Furthermore, for the radio wave absorbents (Examples 1 to 26), the matching thickness and the frequency band for the reflection attenuation of 20 dB or more were measured in the following method, and results are shown in Table 1.

Method of Measuring Matching Thickness and Reflection Attenuation of Radio Wave Absorbent For the radio wave absorbing characteristic, the radio wave absorbent of each composition was processed in an annular shape with an outer diameter of 19.8 mm and an inner diameter of 8.6 mm, and the reflection coefficient was measured with a network analyzer while the radio wave absorbent was inserted in a coaxial tube. The reflection attenuation and the normalized impedance of a radio wave absorbent front face were calculated from the obtained measurement results. The normalized impedance Z and the reflection coefficient S have the following relationship:

$Z=(1+S)/(1-S)$ $S=(Z-1)/(Z+1)$ $S=S_{sample}/S_{metal}$ $-20\log|S|=dB$

The normalized impedance of each thickness was plotted in Smith chart, the thickness passing along the center of Smith chart was obtained by the least square method, and the obtained thickness was regarded as the matching thickness. Furthermore, the ring having the calculated matching thickness was actually prepared, and the frequency band satisfying the reflection attenuation of 20 dB or more was measured by the aforementioned coaxial tube method.

Preparation of Radio Wave-Absorbents (Comparative Examples 1 to 7)

Moreover, for comparison, the radio wave absorbents with the compositions after sintering departing from the aforementioned ranges (Comparative Examples 1 to 6) were prepared in the same manner as the aforementioned radio wave absorbents (Examples 1 to 26). Additionally, the composition, and sintering temperature/retention time of the radio wave absorbents (Comparative Examples 1 to 6) were set as shown in Table 2. Furthermore, the matching thickness of the radio wave absorbent (Comparative Examples 1 to 6) and the frequency band for the reflection attenuation of 20 dB or more were measured in the same manner as aforementioned, and results are shown in Table 2.

Moreover, for comparison, the radio wave absorbent (Comparative Example 7) formed of a nickel-zinc system ferrite having the following composition after sintering was prepared in the same manner as the radio wave absorbents described above (Examples 1 to 26).

iron oxide: 49.3 mol % nickel oxide: 12.0 mol % zinc oxide: 33.0 mol % copper oxide: 5.7 mol %

Additionally, the sintering temperature and retention time of the radio wave absorbent (Comparative Example 7) were set as shown in Table 2. Moreover, the matching thickness of the radio wave absorbent (Comparative Example 7) and the frequency band for the reflection attenuation of 20 dB or more were measured in the same manner as aforementioned, and results are shown in Table 2.

TABLE 1

| RADIO WAVE ABSORBENT | COMPOSITION (MOL %) | | | | | MATCHING THICKNESS (mm) | FREQUENCY BAND FOR REFLECTION ATTENUATION OF 20 dB OR MORE (MHz) | SINTERING TEMPERATURE (° C.) · TIME (hr) |
|---|---|---|---|---|---|---|---|---|
| | MnO | MgO | CuO | ZnO | $Fe_2O_3$ | | | |
| EXAMPLE 1 | 0.3 | 19.7 | 6.2 | 24.6 | 49.2 | 6.2 | 90 to 400 | 1020 · 3 |
| EXAMPLE 2 | 0.3 | 18.4 | 5.8 | 26.3 | 49.2 | 7.1 | 90 to 400 | 1000 · 3 |
| EXAMPLE 3 | 0.3 | 16.5 | 7.7 | 26.3 | 49.2 | 6.9 | 70 to 400 | 1000 · 3 |
| EXAMPLE 4 | 0.3 | 14.6 | 9.6 | 26.3 | 49.2 | 6.9 | 70 to 400 | 1000 · 3 |
| EXAMPLE 5 | 0.4 | 12.8 | 11.5 | 26.3 | 49.0 | 6.5 | 70 to 400 | 1000 · 3 |
| EXAMPLE 6 | 0.3 | 19.1 | 4.2 | 27.1 | 49.3 | 7.9 | 40 to 350 | 1120 · 3 |
| EXAMPLE 7 | 0.3 | 17.4 | 5.8 | 27.3 | 49.2 | 7.9 | 40 to 350 | 1000 · 3 |
| EXAMPLE 8 | 0.3 | 15.6 | 7.7 | 27.3 | 49.1 | 7.3 | 40 to 350 | 1000 · 3 |
| EXAMPLE 9 | 0.3 | 13.6 | 9.7 | 27.3 | 49.1 | 6.9 | 50 to 350 | 1000 · 3 |
| EXAMPLE 10 | 0.3 | 11.8 | 11.5 | 27.3 | 49.1 | 6.6 | 60 to 400 | 1000 · 3 |
| EXAMPLE 11 | 0.3 | 9.9 | 13.4 | 27.3 | 49.1 | 6.3 | 70 to 400 | 1000 · 3 |
| EXAMPLE 12 | 0.3 | 7.4 | 15.7 | 27.2 | 49.4 | 6.0 | 80 to 400 | 1020 · 3 |
| EXAMPLE 13 | 0.4 | 14.5 | 7.7 | 28.3 | 49.1 | 7.8 | 50 to 350 | 1000 · 3 |
| EXAMPLE 14 | 0.4 | 12.7 | 9.6 | 28.3 | 49.0 | 7.8 | 50 to 350 | 1000 · 3 |
| EXAMPLE 15 | 0.4 | 10.7 | 11.6 | 28.3 | 49.0 | 7.6 | 50 to 350 | 1000 · 3 |
| EXAMPLE 16 | 1.8 | 16.1 | 8.0 | 26.3 | 47.8 | 7.0 | 50 to 350 | 1030 · 3 |
| EXAMPLE 17 | 1.8 | 15.2 | 9.0 | 26.2 | 47.8 | 6.9 | 50 to 350 | 1030 · 3 |
| EXAMPLE 18 | 1.8 | 14.1 | 10.0 | 26.3 | 47.8 | 6.7 | 60 to 400 | 1030 · 3 |
| EXAMPLE 19 | 1.8 | 14.4 | 9.3 | 26.5 | 48.0 | 7.0 | 50 to 350 | 1020 · 3 |
| EXAMPLE 20 | 1.8 | 14.2 | 9.6 | 26.5 | 47.9 | 6.9 | 50 to 350 | 1020 · 3 |
| EXAMPLE 21 | 1.8 | 13.9 | 9.9 | 26.5 | 47.9 | 6.8 | 50 to 400 | 1000 · 3 |
| EXAMPLE 22 | 1.9 | 15.5 | 8.0 | 26.8 | 47.8 | 7.4 | 40 to 350 | 1020 · 3 |
| EXAMPLE 23 | 1.8 | 14.5 | 9.0 | 26.8 | 47.9 | 7.2 | 50 to 350 | 1020 · 3 |
| EXAMPLE 24 | 1.8 | 13.6 | 9.9 | 26.8 | 47.9 | 6.9 | 60 to 400 | 1020 · 3 |
| EXAMPLE 25 | 3.9 | 13.3 | 9.8 | 26.4 | 46.6 | 7.4 | 40 to 350 | 1030 · 3 |
| EXAMPLE 26 | 5.8 | 13.2 | 9.8 | 26.1 | 45.1 | 7.9 | 60 to 400 | 1030 · 3 |

TABLE 2

| RADIO WAVE ABSORBENT | COMPOSITION (MOL %) | | | | | MATCHING THICKNESS (mm) | FREQUENCY BAND FOR REFLECTION ATTENUATION OF 20 dB OR MORE (MHz) | SINTERING TEMPERATURE (° C.) · TIME (hr) |
|---|---|---|---|---|---|---|---|---|
| | MnO | MgO | CuO | ZnO | $Fe_2O_3$ | | | |
| COMPARATIVE EXAMPLE 1 | 0.3 | 20.0 | 3.3 | 27.1 | 49.3 | 8.4 | 40 to 300 | 1100 · 3 |
| COMPARATIVE EXAMPLE 2 | 0.3 | 5.6 | 17.7 | 27.1 | 49.3 | 6.0 | 100 to 350 | 1020 · 3 |
| COMPARATIVE EXAMPLE 3 | 0.3 | 15.9 | 10.9 | 23.5 | 49.4 | 5.6 | 150 to 500 | 1020 · 3 |
| COMPARATIVE EXAMPLE 4 | 0.3 | 10.4 | 10.9 | 29.3 | 49.4 | 8.8 | 40 to 300 | 1020 · 3 |
| COMPARATIVE EXAMPLE 5 | 4.0 | 22.0 | 1.0 | 27.1 | 49.3 | 8.1 | 30 to 350 | 1300 · 2 |
| COMPARATIVE EXAMPLE 6 | 6.4 | 12.9 | 9.8 | 26.0 | 44.9 | 8.4 | 70 to 400 | 1030 · 3 |
| COMPARATIVE EXAMPLE 7 | — | — | — | — | — | 6.8 | 45 to 400 | 1090 · 3 |

As shown in Table 1, each of the radio wave absorbents of the present invention (Examples 1 to 26) has a matching thickness of less than 8 mm. It has also been confirmed that its sintering temperature is in the range of 950 to 1150° C. and that the temperature is relatively low in the same manner as the sintering temperature of the nickel-zinc system ferrite material. It is understood that especially the magnesium-zinc system ferrite radio wave absorbent (Example 21) having the composition after sintering of 47.9 mol % of iron oxide, 13.9 mol % of magnesium oxide, 26.5 mol % of zinc oxide, 9.9 mol % of copper oxide, 1.8 mol % of manganese oxide has a smaller matching thickness as compared with the comparative example of magnesium-zinc system ferrite radio wave absorbent, and has the matching thickness and the radio wave absorbing characteristic similar to those of the conventional nickel-zinc system ferrite radio wave absorbent (Comparative Example 7).

When the radio wave absorbents of the present invention (Examples 1 to 26) are observed in further detail, in a case where the content of copper oxide is small in the range of 4 to 16 mol %, the lower limitation frequency of the frequency band satisfying the reflection attenuation of 20 dB or more tends to be raised. As the content of copper oxide increases, the lower limitation frequency of the frequency band satisfying the reflection attenuation of 20 dB or more lowers, and the matching thickness tends to be thinned (e.g., Examples 1 to 4). If the content of copper oxide is further increased in the range of 4 to 16 mol %, the lower limitation frequency of the frequency band satisfying the reflection attenuation of 20 dB or more tends to be raised again (e.g., Examples 9 and 10, 11, 12).

Moreover, as the content of zinc oxide decreases in the range of 24 to 28.5 mol %, the matching thickness is thinned, and the lower and upper limitation frequencies of the frequency band satisfying the reflection attenuation of 20 dB or more tend to be raised (e.g., Examples 3 and 13).

Furthermore, if manganese oxide is substituted for iron oxide in such a manner that the content of manganese oxide falls in the range of 0.1 to 6 mol %, with the increase of the substituting group (MnO), the lower limitation frequency of the frequency band satisfying the reflection attenuation of 20 dB or more is lowered, while the absorbing band is expanded (e.g., Examples 4 and 18, 21).

On the other hand, as shown in Table 2, the radio wave absorbents constituted of magnesium-zinc system ferrite in the same manner as the radio wave absorbent of the present invention (Comparative Examples 1 to 6) result in any one of: (1) the matching thickness becomes 8 mm or more; (2) the frequency band satisfying the reflection attenuation of 20 dB or more becomes narrower than the range of 90 MHz to 350 MHz, or largely departs from the range of 90 MHz to 350 MHz; and (3) the sintering temperature of 1200° C. or more is necessary.

INDUSTRIAL APPLICABILITY

The radio wave absorbent of the present invention can be industrially used as a preferable radio wave absorbent in a radio wave dark room, a radio wave absorptive wall, and the like.

What is claimed is:

1. A radio wave absorbent obtained by sintering a magnesium-zinc system ferrite material which comprises:
    as a main component, a magnesium-zinc system ferrite comprising 45 to 49.4 mol % of iron oxide, 7 to 19.7 mol % of magnesium oxide, 24 to 28.5 mol % of zinc oxide, 4 to 16 mol % of copper oxide, and 0.1 to 6 mol % of manganese oxide.
2. The radio wave absorbent according to claim 1 wherein a matching thickness is less than 8 mm.
3. The radio wave absorbent according to claim 2 wherein a reflection attenuation in a frequency band of 90 MHz to 350 MHz is 20 dB or more.
4. The radio wave absorbent according to claim 1 wherein a sintering temperature is in the range of 950 to 1150° C.

* * * * *